United States Patent

[11] 3,615,937

[72] Inventors Robert H. Collins
Poughkeepsie;
Frank T. Deverse, Wappingers Falls, both of N.Y.

[21] Appl. No. 737,355
[22] Filed June 17, 1968
[45] Patented Oct. 26, 1971
[73] Assignee International Business Machines Corporation
Armonk, N.Y.

[54] PLASTICIZER ADDITIVE TO PHOTORESIST FOR THE REDUCTION OF PIN HOLES
9 Claims, No Drawings

[52] U.S. Cl. .......... 148/187, 96/27, 96/34, 96/36.2, 96/88, 156/17, 148/186
[51] Int. Cl. .......... H01l 7/00, H01l 7/34
[50] Field of Search .......... 148/186, 187, 33.3; 156/17; 96/27, 34, 36.2, 38.4, 114, 4, 88

[56] References Cited

UNITED STATES PATENTS

| | | | |
|---|---|---|---|
| 3,226,611 | 12/1965 | Haenichen .......... | 148/33.3 |
| 3,376,138 | 4/1968 | Giangualano et al. .......... | 96/36.2 |
| 3,457,073 | 7/1969 | Delzenne .......... | 96/88 |

*Primary Examiner*—L. Dewayne Rutledge
*Assistant Examiner*—R. A. Lester
*Attorney*—Sughrue, Rothwell, Mion, Zinn & MacPeak

ABSTRACT: A method of providing high output monolithic semiconductor devices wherein a silicon dioxide layer is coated with a photoresist material containing a highly volatile, low molecular weight, ester-type plasticizer.

PLASTICIZER ADDITIVE TO PHOTORESIST FOR THE REDUCTION OF PIN HOLES

BACKGROUND OF THE INVENTION

1. Field of the Invention

This invention relates to improvements in semiconductor devices and more particularly to improved methods for fabricating semiconductor devices.

2. Description of the Prior Art

As conventionally fabricated, monolithic semiconductor devices, such as integrated circuits, particularly those having diffused resistors, transistors and diodes within the same structure, field effect transistors and the like, are formed by diffusing a P- or N-type impurity into a crystalline semiconductor wafer, usually a crystalline silicon wafer. According to the conventional technique, a layer of silicon dioxide is formed on the surface of the wafer by any of the various well known techniques in the art, such as evaporation of silicon dioxide, thermal oxidation of silicon and oxygen, or by cathode sputtering of silicon through an oxygen atmosphere. A thin layer of a photoresist or a light initiated polymerizable substance is coated or deposited onto the oxide coating and selectively exposed to a suitable light pattern which causes polymerization within those regions of the resist which are intended to become the regions for subsequent impurity diffusion. The photoresist is then developed by removal of the unexposed regions with a suitable solvent which exposes portions of the underlying silicon dioxide layer for subsequent etching. The hardened, light exposed, polymerized portions of the photoresist thereafter serve as a mask to protect the selected areas from contact with the etchant. The portions of the silicon dioxide layer beneath the unexposed photoresist are removed by a suitable etchant, such as, ammonium fluoride, hydrogen fluoride or nitric acid, in order to present a specific region of the silicon surface to the N-type or P-type diffusion. The polymerized portion of the resist is removed by a suitable stripping agent, such as, methylene chloride, leaving a silicon wafer having silicon dioxide protected surface areas and exposed silicon regions. N-type or P-type diffused regions are thereafter formed in the conventional manner by diffusing a suitable impurity such as phosphorus, arsenic, antimony, aluminum, gallium or indium into the silicon body through the exposed portions of the silicon substrate.

It has been long recognized, however, that due to the presence of microscopic and macroscopic imperfections in the polymerized photoresist mask, a quantity of etchant will often tend to penetrate the mask, causing minute portions of the underlying silicon dioxide to be etched away. These pinhole-type imperfections leave undesirable areas of the silicon substrate exposed to impurity diffusion thereby permitting the formation of unwanted and even deleterious PN-junctions within the wafer. This significantly reduces the output of the semiconductor device relative to that which would be expected from theoretical calculations.

Another problem encountered in the conventional prior art technique of semiconductor fabrication has been the tendency for shorting to occur upon the deposition of the metallic contact onto the semiconductor device. According to this technique, a suitable metallic material, such as gold, aluminum or the like is deposited over the oxide layer after termination of the impurity diffusion procedure, to form contacts with the diffused regions. Where surface imperfections or pinholes are present, the deposited metal can migrate through the oxide surface causing shorting to occur between a P or N-type region. While shorting is a relatively severe problem in simple devices, the problem is even more vastly accentuated in those high density monolithic structures having a high number of metallic over coatings per unit area. It would be highly desirable, therefore, to provide a method for reducing or eliminating the number and extent of these pinhole-type imperfections in the photoresist layer both in order to provide a higher output device and to eliminate the frequency of shorting with simple and complex monolithic units.

While it is not altogether clear, it is now believed that these pinhole-type imperfections may be caused by irregularities of the silicon dioxide surface which cause the photoresist to coat the oxide more thinly in some regions than in others. Accordingly, it would be desirable to provide a method whereby the surface continuity and flexibility of the photoresist coating could be improved to compensate for these inevitably present oxide surface irregularities.

It is, therefore, an object of this invention to provide a high output integrated circuits and semiconductor devices. It is another object of this invention to provide a method for reducing and substantially eliminating the pinholing effect commonly occurring in photoresist layers. It is also an object of this invention to provide a method for eliminating the formation of undesired and deleterious surface imperfections in the silicon dioxide mask during fabrication of PN-type devices. It is a further object of this invention to provide coatings of photoresist having a high degree of continuity and flexibility. Another object is to provide a method for selectively diffusing a doping material into a silicon base to form well defined P- and N-type regions without creating unwanted and deleterious PN-junctions which reduce the output of the device. A still further object is to provide monolithic devices and particularly high-density monolithic devices which are substantially free of undesirable shorting between the P and the N-type regions.

SUMMARY OF THE INVENTION

These and other objects are attained herein by providing a photresist material which is capable of forming a highly continuous, uniform, flexible and pinhole free coating whereby a small quantity of highly volatile and low molecular weight ester-type plasticizer is admixed with the photoresist. While a large variety of photoresist materials may be improved by this technique, good results have been obtained with isoprene rubber containing photoresists and especially with partially cyclized cis-polyisoprene containing photoresists.

DETAILED DESCRIPTION OF THE INVENTION

According to this invention, a minor portion of an ester-type plasticizer is admixed with the photoresist material prior to coating the silicon dioxide insulating layer of the silicon wafer. Any highly volatile ester-type plasticizer having a molecular weight below about 500 which is miscible or soluble with the photoresist, is operable within the scope of this invention. Preferred plasticizers for isoprene rubber containing photoresists have been found to be the alkyl and dialkyl phthalates, maleates and adipates containing up to 12 carbon atoms in each alkyl group. Good results have been attained with dibutyl adipate, diallyl adipate, di-n-butyl maleate, diallyl maleate, dibutyl phthalate, dioctyl phthalate, butyl octyl phthalate, diethyl maleate, diethyl adipate, didecyl phthalate and diethyl phthalate. Most preferred, however, for best results, has been found to be dibutyl adipate.

The plasticizer may be mixed with the photoresist in amounts of between 1 percent by volume to about 10 percent by volume and preferably in amounts of between 3 percent to 4 percent by volume to provide the highest photoresist resolution upon developing and to provide the highest reduction in pinhole occurance. When a greater amount of plasticizer is used the degree of pinholing is substantially increased thereby offsetting the advantages gained by using the plasticizer.

As indicated previously, a wide variety of photoresist coatings can be improved by the techniques of this invention to provide the highest degree of coatability, flexibility and continuity. Among those materials found to be especially suitable are the natural or synthetic isoprene rubber containing photoresists and more particularly, the partially cyclized cis-polyisoprene containing materials, such as those which are well known in the photoresist art and which are available commercially under the trade names KTFR and KMER. These photoresists normally contain small amounts of a photoinitiator or a photosensitizer which decompose under the action of ultraviolet light to yield a free radical species which initiates the polymerization reaction. Especially suitable photoinitiators, well known in the art, include the azides, such as 2,6-bis(p-azidobenzylidene)-4-methylcyclohexanone. Particularly good results have been obtained with KTFR-type photoresist materials.

To show the effect that the addition of plasticizers have on the photoresist coatings in reducing pinholing, 8 inch ×8 inch-silicon wafers were coated with photoresist materials containing diallyl maleate and di-n-butyl Adipate and compared with similar wafers coated with the unplasticized photoresist material. The results are shown in the following table.

TABLE I

| | Experiment #1 | | Experiment #2 | | Experiment #3 | |
|---|---|---|---|---|---|---|
| | Pinhole avg. 13 wafers | Percent fewer pinholes than reg. resist | Pinhole avg. 13 wafers | Percent fewer pinholes than reg. resist | Pinhole avg. 13 wafers | Percent fewer pinholes than reg. resist |
| KTFR plus 35% Daillyl Maleate Plasticizer....... | 26 | 68 | 60 | 28 | 36 | 49 |
| KTFR plus 3% di-n-butyl Adipate Plasticizer....... | 29 | 65 | 31 | 63 | 21 | 70 |
| Regular KTFR... | 82 | ............... | 84 | ............... | 69 | ............. |
| Uncoated Wafers Standard......... | 13 | .............. | 5 | ............... | 11 | ............. |

Each of the wafers were etched with chlorine so as to render the pinholes easier to accurately count. The surface coating was investigated under a 400-power magnification. As can be seen from this table, a significant reduction in the number of pinholes on wafers coated with a plasticized resist composition is obtained in comparison with the unplasticized resist. With the plasticizer, di-n-butyl adipate, a 65 percent reduction in pinholes was obtained, while with the plasticizer, diallyl maleate pinhole reduction ranged from 28 percent to about 68 percent. Substantially similar results have been obtained with diallyl adipate, di-n-butyl maleate, dibutyl phthalate, dioctyl phthalate, butyl octyl phthalate, diethyl maleate, diethyl adipate and diethyl phthalate.

Although the mechanism by which the plasticizer affects the reduction in pinholes is not known precisely, it is clear, however, that the plasticizer does not take part in the polymerization of the resist and acts simply as a mechanical plasticizer to increase the coverability of the resist.

While this invention has been described principally in relation to the preparation of P- and N-type semiconductors, the present technique has wide applicability to any device requiring uniform, continuous and flexible coverings of photoresist material, for example, this technique is desirable for producing intagelo images suitable for use in gravure printing and for producing printing reliefs suitable for use as letter press lines and half-tone printing plates. It should be understood, therefore, that many variations and modifications can be made from the present disclosure without departing from the spirit and scope thereof.

What we claim and desire to be protected by Letters Patent is:

1. In a method for providing high output, monolithic semiconductor devices, the improvement which comprises:
   - a. forming a silicon dioxide layer on a silicon substrate,
   - b. coating the silicon dioxide layer with a photoresist material containing from 1 percent to about 10 percent by volume of a highly volatile ester type plasticizer having a molecular weight of less than about 500, said ester-type plasticizer being selected from the group consisting of the alkyl, dialkyl and diallyl phthalates, maleates, adipates and mixtures thereof, wherein each alkyl group contains up to 12 carbon atoms,
   - c. exposing said photoresist material to a suitable light pattern so as to cause selective polymerization,
   - d. removing the unpolymerized photoresist and etching the exposed silicon dioxide surface, and
   - e. diffusing a suitable impurity material into said silicon wafer through the etched surface of said silicon dioxide layer.
2. The method of claim 1 wherein said ester-type plasticizer is selected from the group consisting of dibutyl adipate, diallyl adipate, di-n-butyl maleate, diallyl maleate, dibutyl phthalate, dioctyl phthalate, butyl octyl phthalate, diethyl maleate, diethyl adipate, didecyl phthalate and mixtures thereof.
3. The method of claim 1 wherein said ester-type plasticizer is dibutyl adipate.
4. The method of claim 1 wherein said photoresist material is a natural or synthetic rubber containing photoresist.
5. The method of claim 4 wherein said photoresist is a partially cyclized polyisoprene containing photoresist.
6. The method of claim 1 wherein said ester-type plasticizer is admixed with said photoresist in an amount of from about 3 percent to about 6 percent by volume.
7. The method of claim 1 wherein said plasticizer is selected from the group consisting of dialkyl phthalates, maleates, adipates and mixtures thereof, wherein each alkyl group contains up to 12 carbon atoms.
8. The method of claim 1 wherein said plasticizer is selected from the group consisting of diallyl phthalates, maleates, adipates and mixtures thereof.
9. The method of claim 1 wherein said plasticizer is selected from the group consisting of alkyl phthalates, maleates, adipates and mixtures thereof, wherein said alkyl group has up to 12 carbon atoms.